United States Patent
Teitel et al.

(10) Patent No.: US 10,382,069 B2
(45) Date of Patent: Aug. 13, 2019

(54) DATA ENCODING BY EFFICIENT INVERSION OF A PARITY-CHECK SUB-MATRIX

(71) Applicant: APPLE INC., Cupertino, CA (US)

(72) Inventors: Moti Teitel, Tel Aviv (IL); Tomer Ish-Shalom, Raanana (IL); Yonathan Tate, Kfar Saba (IL)

(73) Assignee: APPLE INC., Cupertino, CA (US)

( * ) Notice: Subject to any disclaimer, the term of this patent is extended or adjusted under 35 U.S.C. 154(b) by 132 days.

(21) Appl. No.: 14/823,061

(22) Filed: Aug. 11, 2015

(65) Prior Publication Data

US 2017/0047948 A1    Feb. 16, 2017

(51) Int. Cl.
 *H03M 13/11* (2006.01)
 *H03M 13/00* (2006.01)

(52) U.S. Cl.
 CPC ....... *H03M 13/616* (2013.01); *H03M 13/116* (2013.01); *H03M 13/611* (2013.01); *H03M 13/6502* (2013.01)

(58) Field of Classification Search
 CPC .... H03M 13/09; H03M 13/091; H03M 13/15; H03M 13/1515; H03M 13/616; H03M 13/6502; H03M 13/116; H03M 13/611; H04L 1/0057
 USPC .......................................................... 714/781
 See application file for complete search history.

(56) References Cited

U.S. PATENT DOCUMENTS

| | | | | |
|---|---|---|---|---|
| 7,581,157 | B2 * | 8/2009 | Oh | H03M 13/1148 714/781 |
| 8,196,025 | B2 * | 6/2012 | Lakkis | H03M 13/1105 714/800 |
| 8,361,269 | B2 * | 1/2013 | Sakakibara | B21D 28/26 156/250 |
| 8,433,984 | B2 * | 4/2013 | Khandekar | H03M 13/6516 714/751 |
| 8,631,269 | B2 * | 1/2014 | Vinayak | G06F 11/1662 714/4.11 |
| 9,407,291 | B1 * | 8/2016 | Weingarten | H03M 13/2906 |
| 2004/0117719 | A1 * | 6/2004 | Lehobey | H03M 13/15 714/781 |

(Continued)

*Primary Examiner* — Albert Decady
*Assistant Examiner* — Enam Ahmed
(74) *Attorney, Agent, or Firm* — Kligler & Associates

(57) ABSTRACT

A method for data encoding includes receiving a data vector to be encoded into a code word in accordance with a code defined by a parity-check matrix H. An intermediate vector $\underline{s}$ is produced by multiplying the data vector by a data sub-matrix $H_s$ of the parity-check matrix H. A parity part of the code word is derived by applying a sequence of operations to the intermediate vector $\underline{s}$ based on a decomposition of a parity sub-matrix $H_p$ of the matrix H using matrices A, C, U and V, in which decomposition A is a block triangular matrix that has the same size as $H_p$, C is matrix that is smaller than $H_p$, and the matrices U and V are placement matrices that are selected so that A, C, U and V satisfy a matrix equation $H_p = A + UCV$.

24 Claims, 3 Drawing Sheets

(56) References Cited

U.S. PATENT DOCUMENTS

| | | | | |
|---|---|---|---|---|
| 2005/0149833 A1* | 7/2005 | Worley | ............... | H03M 13/19 |
| | | | | 714/781 |
| 2005/0216820 A1* | 9/2005 | Ha | ............... | H03M 13/118 |
| | | | | 714/752 |
| 2009/0300461 A1* | 12/2009 | Shor | ............... | H03M 13/1114 |
| | | | | 714/752 |
| 2010/0205511 A1* | 8/2010 | Murakami | ............... | H03M 13/118 |
| | | | | 714/781 |
| 2011/0289351 A1* | 11/2011 | Rashmi | ............... | G06F 11/1662 |
| | | | | 714/6.32 |
| 2012/0221915 A1* | 8/2012 | Eroz | ............... | H03M 13/1137 |
| | | | | 714/752 |
| 2015/0095747 A1* | 4/2015 | Tamo | ............... | H03M 13/151 |
| | | | | 714/781 |

* cited by examiner

US 10,382,069 B2

DATA ENCODING BY EFFICIENT INVERSION OF A PARITY-CHECK SUB-MATRIX

TECHNICAL FIELD

Embodiments described herein relate generally to Error Correction Coding (ECC), and particularly to methods and systems for ECC encoding.

BACKGROUND

In various fields, such as data communications and data storage, the data is protected by applying Error Correction Coding (ECC). ECC typically involves calculating redundancy or parity bits that can be used for detecting and correcting corrupted data. Some types of error correction codes, such as Low-Density Parity-Check (LDPC) and Generalized LDPC (GLDPC) codes, can be defined using a respective parity-check matrix.

SUMMARY

An embodiment that is described herein provides a method for data encoding that includes receiving, via an interface of a data encoder, a data vector to be encoded into a code word in accordance with a code defined by a parity-check matrix H. An intermediate vector $\underline{s}$ is produced, by encoding circuitry of the data encoder, by multiplying the data vector by a data sub-matrix $H_s$ of the parity-check matrix H. A parity part of the code word is derived, by the encoding circuitry, by applying a sequence of operations to the intermediate vector $\underline{s}$ based on a decomposition of a parity sub-matrix $H_p$ of the matrix H using matrices A, C, U and V, in which decomposition A is a block triangular matrix that has the same size as $H_p$, C is matrix that is smaller than $H_p$, and the matrices U and V are placement matrices that are selected so that A, C, U and V satisfy a matrix equation $H_p = A + UCV$.

In some embodiments, applying the sequence of operations is equivalent to multiplying the vector $\underline{s}$ by an inverse of the parity sub-matrix, $H_p^{-1}$. In other embodiments, applying the sequence of operations includes solving an equation of a form $A \cdot \underline{y} = \underline{x}$ using a back-substitution process. In yet other embodiments, applying the sequence of operations includes multiplying a matrix $UW^{-1}V$ by a vector $\underline{y}$ that equals $A^{-1} \cdot \underline{s}$, $W^{-1}$ is an inverse matrix of a matrix $W = (C^{-1} + V \cdot A^{-1} \cdot U)$.

In an embodiment, the matrix $W^{-1}$ is pre-calculated before applying the sequence of operations. In another embodiment, the matrix W is predefined, and multiplying the matrix $UW^{-1}V$ by the vector $\underline{y}$ includes applying the sequence of operations to the vector $\underline{y}$ based on a decomposition of the matrix W using matrices A', C', U' and V', in which decomposition A' is a block triangular matrix that has the same size as W, C' is a matrix that is smaller than W, and the matrices U' and V' are placement matrices that are selected so that A', C', U' and V' satisfy a matrix equation $W = A' + U'C'V'$.

In some embodiments, the parity-check sub-matrix $H_p$ includes multiple circulant sub-matrices structured from cyclically shifted versions of an identity matrix, and applying the sequence of operations includes applying vector cyclic shift operations in accordance with a structure of the respective circulant sub-matrices. In other embodiments, the code includes multiple component codes, the parity-check sub-matrix $H_p$ includes one or more block-circulant matrices, each including multiple blocks that belong to respective component parity-check matrices of the component codes. In yet other embodiments, the parity-check sub-matrix $H_p$ includes interleaved block-columns of the block-circulant matrices.

In an embodiment, receiving the data vector includes retrieving the data vector for storage in a memory device. In another embodiment, receiving the data vector includes receiving the data vector for transmission in a communication system.

There is additionally provided, in accordance with an embodiment that is described herein, a data encoder, including an interface and encoding circuitry. The interface is configured to receive a data vector to be encoded into a code word in accordance with a code defined by a parity-check matrix H. The encoding circuitry is configured to produce an intermediate vector $\underline{s}$ by multiplying the data vector by a data sub-matrix $H_s$ of the parity-check matrix H, and to derive a parity part of the code word by applying a sequence of operations to the vector $\underline{s}$ based on a decomposition of a parity sub-matrix $H_p$ of the matrix H using matrices A, C, U and V, in which decomposition A is a block triangular matrix that has the same size as $H_p$, C is matrix that is smaller than $H_p$, and the matrices U and V are placement matrices that are selected so that A, C, U and V satisfy a matrix equation $H_p = A + UCV$.

There is additionally provided, in accordance with an embodiment that is described herein, a computer software product, the product including a tangible non-transitory computer-readable medium in which program instructions are stored, which instructions, when read by a processor of a data encoder, cause the processor to receive, via an interface of the data encoder, a data vector to be encoded into a code word in accordance with a code defined by a parity-check matrix H, and, to produce an intermediate vector $\underline{s}$ by multiplying the data vector by a data sub-matrix $H_s$ of the parity-check matrix H, and to derive a parity part of the code word by applying a sequence of operations to the vector $\underline{s}$ based on a decomposition of a parity sub-matrix $H_p$ of the matrix H using matrices A, C, U and V, in which decomposition A is a block triangular matrix that has the same size as $H_p$, C is matrix that is smaller than $H_p$, and the matrices U and V are placement matrices that are selected so that A, C, U and V satisfy a matrix equation $H_p = A + UCV$.

These and other embodiments will be more fully understood from the following detailed description of the embodiments thereof, taken together with the drawings in which:

DETAILED DESCRIPTION OF EMBODIMENTS

Overview

Figure 1:
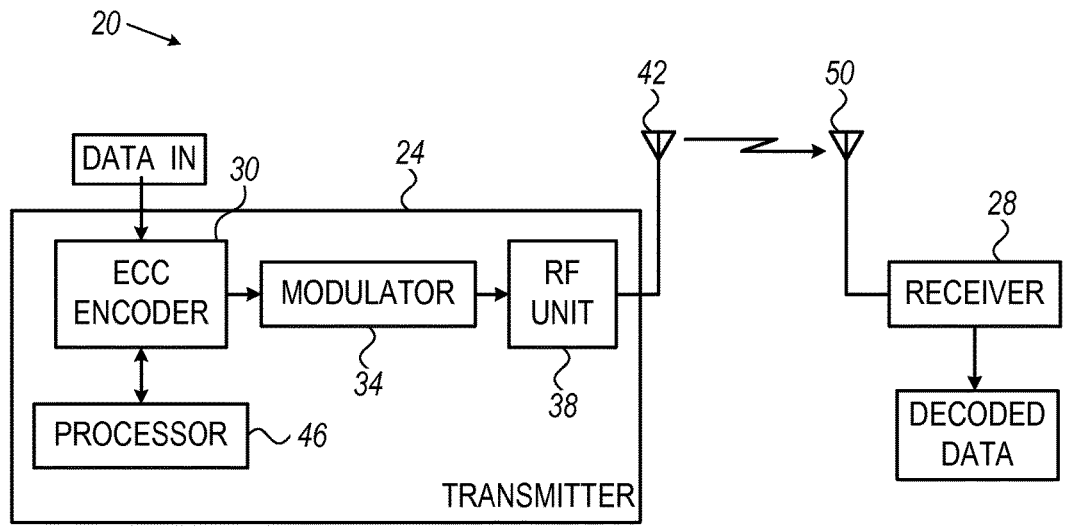
FIG. 1 is a block diagram that schematically illustrates a wireless communication system that uses error correction coding, in accordance with an embodiment that is described herein.

In various applications, certain data needs to be protected using Error Correction Coding (ECC). An ECC encoder typically processes the data to generate respective code words in accordance with a given code, wherein each code word includes one or more redundancy or parity bits. Depending on the application, the code words may get corrupted for various reasons. In decoding a code word, the parity bits can be used for recovering the uncorrupted data.

Some types of error correction codes, such as, for example, Low-Density Parity-Check (LDPC) and Generalized LDPC (GLDPC) codes, can be defined using a respective parity-check matrix. Embodiments that are disclosed herein provide improved methods and systems for data encoding by efficient inversion of a sub-matrix of the parity-check matrix.

In the description that follows and in the claims matrices are denoted by capital letters, possibly including a subscript letter, and vectors are denoted by a letter having an underline or an over-line. Underline and over-line notation is used interchangeably. For example, a vector $\underline{s}$ may also be referred to as $\bar{s}$.

In some embodiments, the encoding process is based on decomposition of the parity-check matrix H into a data sub-matrix $H_s$ and a parity sub-matrix $H_p$ so that $H=[H_s|H_p]$. Given an input vector $\underline{d}$, the encoder can, in principle, calculate the parity bits $\underline{p}$ by multiplying an intermediate vector $\underline{s}=H_s \cdot \underline{d}$ by the inverse matrix $H_p^{-1}$.

Such an encoding scheme requires holding $H_p$ in memory (e.g., in certain codes such as LDPC, $H_p$ can be stored efficiently) and calculating $H_p^{-1}$ in real time. Alternatively, the encoder can hold a pre-calculated inverse matrix in memory. In typical real-life application, however, $H_p$ is very large (e.g., on the order of several hundreds of bits per dimension), and therefore cannot be inverted in real time. Additionally, $H_p^{-1}$ is typically dense, and holding $H_p^{-1}$ in memory requires a large storage space. Moreover, multiplying $\underline{s}$ by a large matrix $H_p^{-1}$ requires intensive processing. In the disclosed techniques, $H_p$ is decomposed in a way that results in efficient encoding, both in terms of storage space and complexity.

In some embodiments, $H_p$ can be decomposed as $H_p=A+UCV$, wherein A is a block lower triangular matrix of the same size as $H_p$, and C is a matrix that is smaller than $H_p$. U and V are placement matrices that scatter elements of C within the area of $H_p$ so as to satisfy the matrix equation $H_p=A+UCV$. Using this decomposition, efficient encoding is achieved based on the Woodbury matrix identity that defines the inverse of (A+UCV) in terms of the inverse matrices $A^{-1}$ and $C^{-1}$.

In some embodiments, the parity part of the code word is derived by solving a matrix equation of the form $A\underline{y}=\underline{x}$. Since by the above decomposition, A is a block triangular matrix, $\underline{y}$ can be derived efficiently using a back-substitution process. In addition, deriving the parity part comprises a matrix by vector multiplication operation in which the matrix has the same size as the matrix C of the decomposition. With proper design, the matrix C is much smaller than $H_p$, which results in significant reduction in storage space and complexity.

In some of the disclosed embodiments, the underlying code comprises a Quasi-Cyclic LDPC (QC-LDPC) code, and the respective $H_p$ matrix comprises circulant sub-matrices that are derived from cyclically shifted versions of the identity matrix. In such embodiments, implementing the back-substitution process and the matrix multiplication operation can be further optimized using cyclic shift operations in accordance with the structure of the circulant sub-matrices.

In some embodiments, the underlying code comprises a GLDPC code that comprises multiple component codes. The GLDPC encoder generates a composite code word that comprises multiple respective component code words of the component codes. In an embodiment, the parity-check sub-matrix $H_p$ of the GLDPC code is constructed from one or more block-circulant matrices, each of which comprises multiple blocks that belong to respective parity-check matrices of the component codes. Hp can be constructed, for example, by interleaving block-columns of multiple such block-circulant matrices. This matrix construction results in a matrix $H_p$ that can be decomposed as Hp=A+UCV, as described above, for efficient encoding.

System Description

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC encoder 30 (the encoded data is also referred to as a code word), modulates the encoded data, using a modulator 34, in accordance with a certain modulation scheme, converts the modulated digital signal to an analog signal, up-converts the analog signal to a suitable Radio frequency (RF) using an RF unit 38 and transmits the RF signal toward the receiver using a transmitting antenna 42. A processor 46 is configured to control the operation of ECC encoder 30. The structure and functionality of encoder 30 will be described in detail below.

In receiver 28 (whose internal elements are not shown), a receiving antenna 50 receives the RF signal and provides it to a RF front end, which down-converts the RF signal to baseband or to a suitable Intermediate Frequency (IF), and digitizes the signal using a suitable Analog to Digital Converter (ADC). The digitized signal carrying the ECC-encoded data (i.e., the received code word possibly containing one or more errors) is demodulated by a modem, and the ECC is decoded by an ECC decoder. By decoding the ECC, the decoder at the receiver reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems or optical communication systems, as well.

Figure 2:
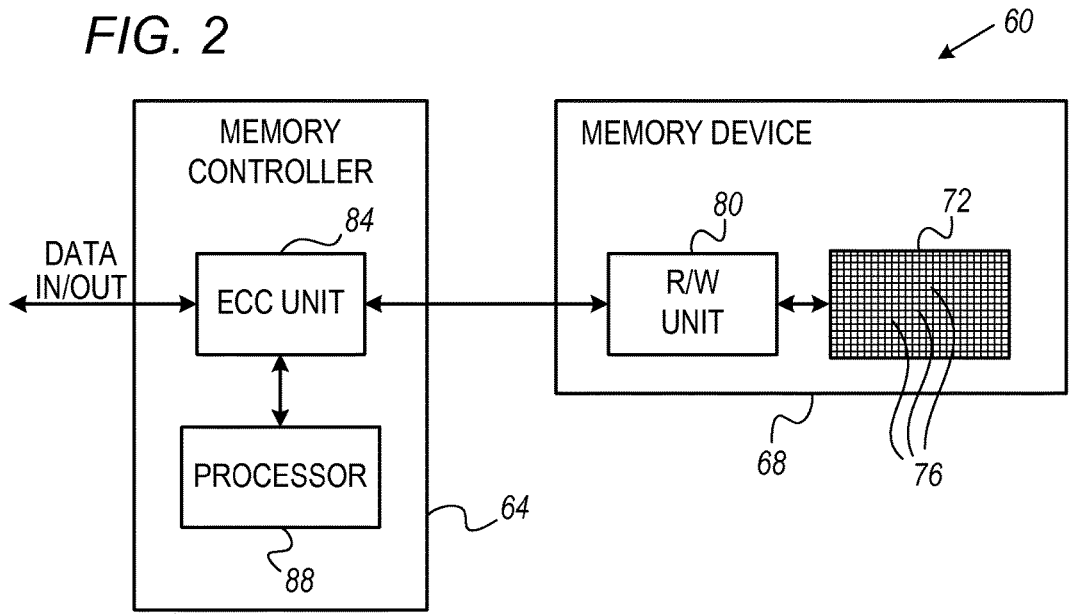
FIG. 2 is a block diagram that schematically illustrates a data storage system that uses error correction coding, in accordance with an alternative embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage in accordance with a certain ECC, and decodes the ECC of data that is retrieved from the memory cells. Unit 84 is controlled by a processor 88. The structure and functionality of the encoding part of unit 84 are described in detail below. The ECC used in systems and 60 may comprise, for example, a Low-Density Parity-Check (LDPC) code, a Generalized Low-Density Parity-Check (GLDPC) code, as well as various other types of ECC.

The ECC encoding schemes described herein can be used in communication systems such as system 20, as well as in data storage systems such as system 60. The description that follows applies to both communication applications and to storage applications, and refers generally to an ECC encoder. Any reference to the ECC encoder applies to encoder 30 of system 20, as well as to the encoder functionality of unit 84 in system 60. Alternatively, the methods described herein can be carried out by any other suitable element in any other suitable system that involves ECC encoding.

ECC encoder 30 of FIG. 1 and ECC unit 84 of FIG. 2 may be implemented in software, in hardware, or using a combination of hardware and software elements. In some embodiments, ECC encoder 30 and/or unit 84 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, ECC encoder 30 and/or unit 84 are implemented in hardware, such as using one or more Application-Specific Integrated Circuits (ASICs), Field-Programmable gate Arrays (FPGAs) and/or discrete components.

Each of ECC encoder 30 and unit 84 comprises an input/output interface (not shown in the figures) for receiving and outputting data and other information. In the context of the description that follows and in the claims, all the elements of ECC encoder 30 and/or unit 84 that are not part of the input/output interface of the encoder are collectively referred to as encoding circuitry.

Figure 3:
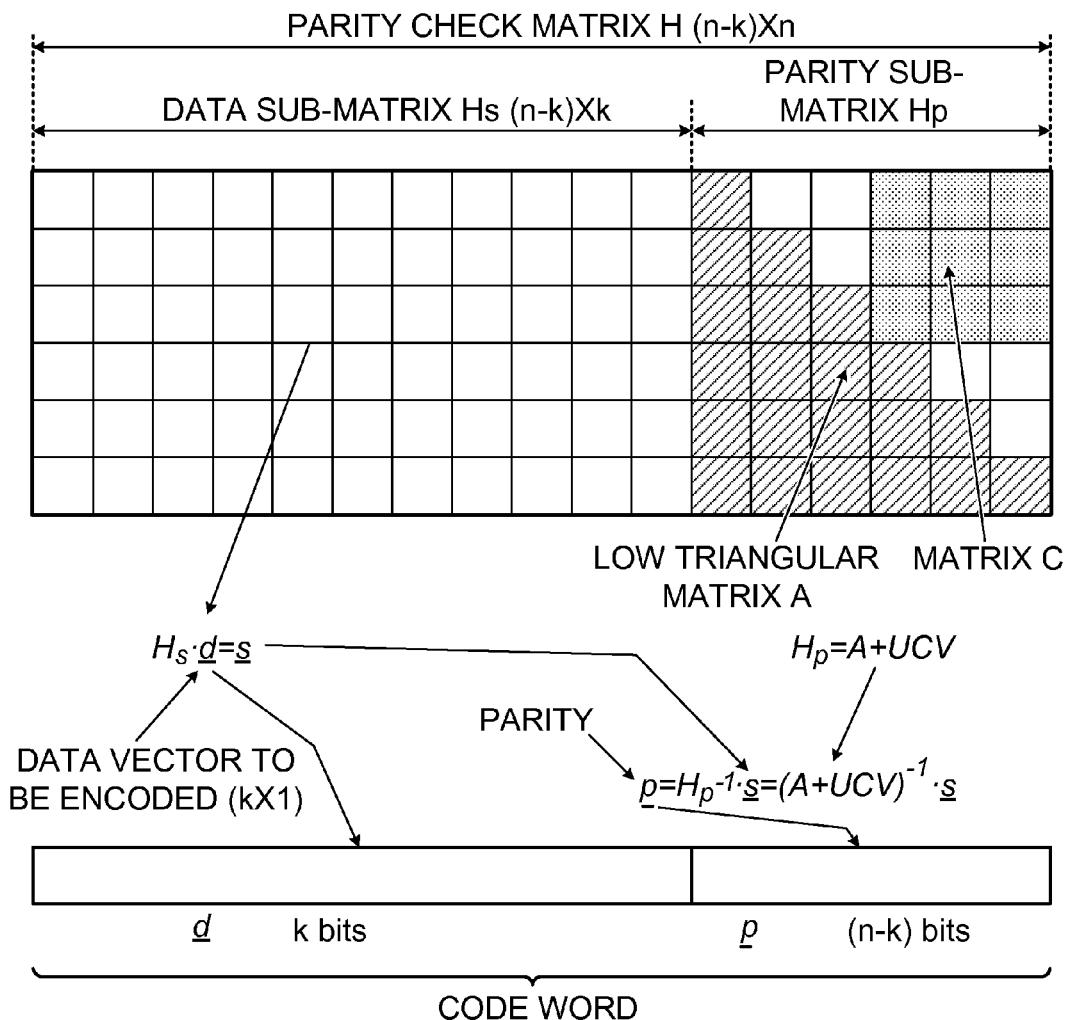
FIG. 3 is a diagram that schematically illustrates a parity-check matrix that is decomposed into suitable sub-matrices for the purpose of error correction coding (ECC) encoding, in accordance with an embodiment that is described herein.

FIG. 3 is a diagram that schematically illustrates a parity-check matrix that is decomposed into suitable sub-matrices for the purpose of error correction coding (ECC) encoding, in accordance with an embodiment that is described herein. The parity-check matrix H in FIG. 3 comprises multiple blocks or sub-matrices. A parity-check matrix of such a structure can be used for defining certain ECC codes such as, for example, various types of LDPC and GLDPC codes.

In FIG. 3, the parity-check matrix H corresponds to a (n, k) code that encodes a k-bit input into a respective n-bit code word, i.e., the code word comprises (n-k) redundancy or parity bits. Although in the description that follows we mainly refer to ECC codes that are based on binary arithmetic in which variables are represented as binary elements or bits, the disclosed embodiments are also applicable to ECC codes that are defined over a non-binary field such as a Galois Field (GF).

In the example of FIG. 3, the parity-check matrix H comprises a (n−k)-by-k data sub-matrix $H_s$ and a (n−k)-by-(n−k) parity sub-matrix $H_p$ so that H=$[H_s|H_p]$. A given code word Cw can be similarly decomposed as Cw=[d|p], wherein d and p correspond to k data bits and n-k parity bits, respectively. Since a valid code word satisfies H·Cw=0, the following equation holds:

$$H_s \cdot \underline{d} + H_p \cdot \underline{p} = \underline{0} \qquad \text{Equation 1:}$$

or equivalently:

$$\underline{p} = -H_p^{-1} \cdot \underline{s} \qquad \text{Equation 2:}$$

wherein, $$\underline{s} = H_s \cdot \underline{d} \qquad \text{Equation 3:}$$

In the embodiments disclosed herein, the ECC encoder first applies Equation 3 to an input vector d to produce an intermediate vector s, and then the ECC encoder uses s in Equation 2 to derive the parity bits p.

As seen in Equation 2, deriving the parity bits involves multiplying the vector s by the inverse matrix $H_p^{-1}$. Calculating the inverse matrix of $H_p$ in real time is typically impractical since the complexity of calculating the inverse matrix of an n-by-n matrix is on the order of $O(n^3)$, and in typical applications $H_p$ can have several hundreds of bits or more per dimension. Alternatively, the encoder can store $H_p^{-1}$ in memory and perform the matrix by vector multiplication of Equation 2 in real time. The storage requirements for $H_p^{-1}$, however, are typically heavy, even when $H_p$ itself can be represents in a compact form for storage. Moreover, the multiplication by $H_p^{-1}$ in Equation 2 is a complex operation that requires intensive processing.

As will be described in detail below, in the disclosed embodiments the parity-check matrix is designed so that $H_p$ can be decomposed into suitable sub-matrices, resulting in efficient encoding and a reduced storage space. In FIG. 3, $H_p$ is decomposed as follows:

$$H_p = A + UCV \qquad \text{Equation 4:}$$

wherein A comprises a full rank block lower triangular matrix of the same size as $H_p$, and C comprises a full rank matrix whose size is smaller than the size of $H_p$. U and V are placement matrices that scatter elements of C within the area of $H_p$ so as to satisfy Equation 4. In the disclosed embodiments, when $H_p$ is decomposed in accordance with Equation 4, the inverse matrix $H_p^{-1}$ can be represented using the Woodbury matrix identity as follows:

$$H_p^{-1} = (A+UCV)^{-1} = A^{-1} - A^{-1}U(C^{-1}+VA^{-1}U)^{-1}VA^{-1} \qquad \text{Equation 5:}$$

Using Equation 5, Equation 2 can be rewritten as:

$$\underline{p} = [A^{-1} - A^{-1}U(C^{-1}+VA^{-1}U)^{-1}VA^{-1}]\underline{s} \qquad \text{Equation 6:}$$

or after left multiplication by the matrix A as:

$$A\underline{p} = \underline{s} - U(C^{-1}+VA^{-1}U)^{-1}VA^{-1}\underline{s} \qquad \text{Equation 7:}$$

As will be described below, when H is designed properly, instead of direct multiplication of s by $H_p^{-1}$ as in given Equation 2, P can derived efficiently by solving Equation 7, which reduces both the storage requirements and complexity, significantly.

Efficient LDPC Encoding

Now we describe embodiments that implement efficient LDPC encoding, based on the decomposition described in Equation 4. In the present example, the LDPC code comprises a Quasi-Cyclic LDPC (QC-LDPC) code, for which the parity-check matrix H is made-up of zero sub-matrices and circulant sub-matrices of size L-by-L. Each circulant sub-matrix is derived from the L-by-L identity matrix by shifting its rows cyclically k positions to the right ($0 \le k \le L-1$).

For a (n, k) QC-LDPC code, whose parity-check matrix H comprises m sub-matrices per column, $H_p$ is a square matrix that comprises $m^2$ sub-matrices of size L-by-L each, wherein $m=(n-k)/L$. Note that although both $H_p$ and its inverse matrix are quasi-cyclic matrices, $H_p$ is a low-density matrix, whereas $H_p^{-1}$ is generally a dense matrix. If we assume that multiplying an L-vector by an L-by-L matrix requires T clock cycles, the full multiplication of $\underline{s}$ by $H_p^{-1}$ requires $m^2 T$ clock cycles.

Table 1 below depicts a compact representation of a parity-check sub-matrix $H_p$ of a QC-LDPC code. Each block in the table comprises an L-by-L zero or circulant sub-matrix. Each of the circulant sub-matrices is defined by a single number $0 \le p\_ij < L$ that corresponds to the respective cyclic shift. For example, $p\_ij=1$ means that the sub-matrix indexed by (i,j) is derived from an L-by-L identity matrix that is shifted cyclically one position.

TABLE 1

$H_p$ of a an example QC-LDPC code

| p_11 | 0    | p_13 | p_14 | p_15 |
|------|------|------|------|------|
| p_21 | p_22 | 0    | P_24 | p_25 |
| p_31 | P_32 | p_33 | 0    | p_35 |
| p_41 | p_42 | p_43 | p_44 | 0    |
| p_51 | p_52 | p_53 | p_54 | p_55 |

A matrix Hp based on Table 1 can be decomposed in accordance with Equation 4, wherein the matrices A and C are depicted in Tables 2 and 3, respectively.

TABLE 2

Matrix A in decomposing $H_p$ of Table1

| p_11 | 0    | 0    | 0    | 0    |
|------|------|------|------|------|
| p_21 | p_22 | 0    | 0    | 0    |
| p_31 | P_32 | p_33 | 0    | 0    |
| p_41 | p_42 | p_43 | p_44 | 0    |
| p_51 | p_52 | p_53 | p_54 | p_55 |

TABLE 3

Matrix C in decomposing $H_p$ of Table1

| p_13 | p_14 | p_15 |
|------|------|------|
| 0    | P_24 | P_25 |
| 0    | 0    | p_35 |

The placement matrices U and V should be selected so as to satisfy the matrix equation $H_p=A+UCV$ of Equation 4. In the present example, U and V place the non-zero sub-matrices of C at the upper right corner of $H_p$ as depicted in Table 1.

Next we describe an efficient encoding method and related variant methods that are suitable for encoding and designing QC-LDPC codes. Methods that are suitable for encoding other types of ECC codes such as, for example, GLDPC codes, are described further below.

Figure 4:
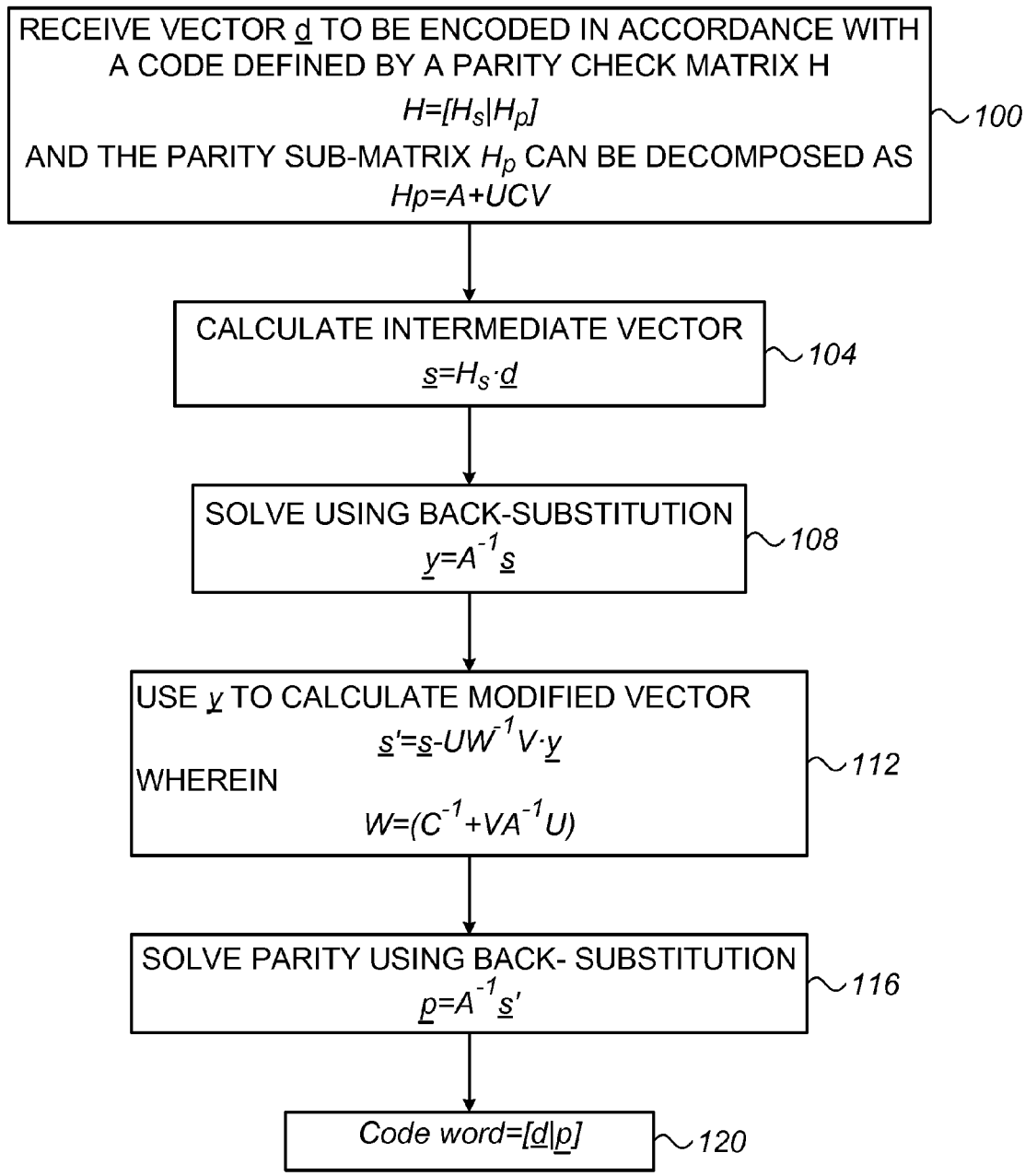
FIG. 4 is a flow chart that schematically illustrates a method for ECC encoding based on efficient matrix inversion, in accordance with an embodiment that is described herein.

FIG. 4 is a flow chart that schematically illustrates a method for ECC encoding, based on efficient matrix inversion, in accordance with an embodiment that is described herein. The method can be implemented, for example, within ECC encoder 30 of FIG. 1 or within ECC unit 84 of FIG. 2.

The method begins with the ECC encoder receiving an input vector $\underline{d}$ to be encoded in accordance with an ECC code defined by a respective parity-check matrix H, at a reception step 100. In the present example, the ECC code comprises a QC-LDPC code for which H comprises zero and circulant L-by-L sub-matrices.

The matrix H comprises a data sub-matrix $H_s$ and a parity sub-matrix $H_p$. The matrix $H_p$ is square and comprises $m^2$ sub-matrices. We assume that $H_p$ can be represented as $H_p=A+UCV$ in accordance with Equation 4, for some matrices A, C, U and V, wherein A and C are full rank, A is a block lower triangular matrix that has the same size as $H_p$, and C is smaller than $H_p$. U and V are suitable placement matrices as described above. Example such decomposition is depicted in Tables 1-3 above.

At an intermediate calculation step 104, given the vector $\underline{d}$, the ECC encoder calculates an intermediate vector $\underline{s}$ in accordance with Equation 3. Next, the ECC encoder solves Equation 7 by performing several steps as described herein.

At a first back-substitution step 108, the ECC encoder calculates a vector $\underline{y}=A^{-1}\underline{s}$ by solving a respective matrix equation:

$$A\underline{y}=\underline{s} \qquad \text{Equation 8:}$$

In an embodiment, since A is a block lower triangular matrix, $\underline{y}$ in Equation 8 can be solved using back-substitution, which is significantly more efficient than multiplying $\underline{s}$ by $A^{-1}$. Equation 8 can be represented as a set of m equations:

$$Y1 = A_{11}^{-1} S1 \qquad \text{Equation 9}$$

$$Y2 = A_{22}^{-1}(S2 - A_{21}Y1)$$

$$Y3 = A_{33}^{-1}(S3 - A_{31}Y1 - A_{32}Y2)$$

...

$$Ym = A_{mm}^{-1}\left(Sm - \sum_{l=1}^{m-1} A_{ml}Y_l\right)$$

wherein each of the Si and Yi variables comprises a sub-vector of length L, and $A_{ij}$ is an L-by-L matrix positioned at block-row i and block-column j of A.

At a vector modification step 112, the ECC encoder calculates a modified vector $\underline{s}'$ of $\underline{s}$ by calculating:

$$\underline{s}'=\underline{s}-UW^{-1}V\cdot\underline{y} \qquad \text{Equation 10:}$$

wherein, $$W^{-1}=(C^{-1}+VA^{-1}U)^{-1} \qquad \text{Equation 11:}$$

In Equations 10 and 11, $W^{-1}$ is a matrix of the same size as C. In an embodiment, the inverse matrix $W^{-1}$ is pre-calculated offline and stored. Note that a proper code design that results in a small sized matrix C is advantageous in terms of both storage space and complexity. Thus, a small sized matrix C corresponds to a respective small sized matrix $W^{-1}$, and therefore requires less storage space than required for storing $A^{-1}$ for a direct calculation of $\underline{y}=A^{-1}\underline{s}$.

In addition, the complexity of multiplying $\underline{y}$ by $UW^{-1}V$ in Equation 11 relates to the size (e.g., number of sub-matrices) of C.

Each of the sub-matrices of $W^{-1}$ in Equation 11 comprises a circulant matrix, or a sum of multiple circulant matrices of different cyclic shift values. As a result, the multiplication by $W^{-1}$ in Equation 10 can be carried out efficiently, on a block basis, using a cyclic shifter module.

At a parity calculation step 116, the ECC encoder calculates the parity $\underline{p} = A^{-1}\underline{s}'$ by solving:

$$A\underline{p} = \underline{s}' \qquad \text{Equation 12:}$$

Similarly to Equation 8, in an embodiment, the ECC encoder solves Equation 12 using back-substitution.

At a code word derivation step 120, the ECC encoder combines the input vector $\underline{d}$ and the computed parity $\underline{p}$ to produce the full code word. The ECC encoder outputs the code word, for example, to an upper level application, and the method then terminates.

In some embodiments, when the L-by-L sub-matrices of the block lower triangular matrix A comprise circulant matrices of a QC-LDPC code, the multiplication by $A_{ii}^{-1}$ in Equation 9 is equivalent to performing a vector cyclic shifting, which can be implemented efficiently using a shifter module. Assuming that processing each circulant matrix in this manner takes a single clock cycle, the full back-substitution process in each of Equations 8 and 12 takes $m(m+1)/2$ clock cycles.

Let m'L-by-m'L denote the dimensions of matrix C (i.e., m'<m). As noted above, since A and C are low-density quasi-cyclic matrices, $W^{-1}$ in Equation 11 is generally a dense quasi-cyclic matrix, and the multiplication by $W^{-1}$ in Equation 10 therefore takes $m'^2T$ clock cycles. The overall processing of solving Equation 7 takes $m(m+1)+m'^2T$ clock cycles. In the decomposition example of Tables 1-3, m=5 and m'=3. Assuming T=8 clock cycles per circulant matrix, the complexity of the method of FIG. 4 (i.e., solving Equation 7), measured in processing clock cycles, is 102 clock cycles, compared to $m^2T=200$ clock cycles that would have been required by using a direct calculation.

The multiplication by $W^{-1}$ in Equation 10 can be further optimized when the matrix W can be decomposed (similarly to Equation 4) as:

$$W = A' + U'C'V' \qquad \text{Equation 13:}$$

wherein A' is a full rank block lower triangular matrix of the same size as W and C' is a full rank matrix smaller than W. Such optimization can be viewed as nested application of the Woodbury matrix identity. In this case, the multiplication of $\underline{y}$ by $W^{-1}$ in Equation 11 can be carried out using steps similar to steps 108, 112 and 116 of the method of FIG. 4. The calculation in this case involves applying two back-substitution procedures corresponding to matrix A', and one matrix multiplication operation with a matrix of the same dimensions as C'.

By careful design of the circulant matrices in $H_p$, the dimensions of C' in Equation 13 can be reduced to further lower the complexity and storage demands. Assume, for example, that each L-by-L sub-matrix of $C^{-1}$ comprises a sum of one or more circulant sub-matrices derived from the identity matrix at different cyclic shift values.

Table 4 below depicts the number of such summed circulant sub-matrices corresponding, for example, to the inverse matrix $C^{-1}$ of the matrix C of Table 3 above.

TABLE 4

The number of summed circulant matrices per sub-matrix of $C^{-1}$

| 1 | <u>1</u> | 2 |
|---|---|---|
| 0 | 1 | <u>1</u> |
| 0 | 0 | 1 |

Similarly, the numbers of summed circulant matrices in each sub-matrix of $A^{-1}$ in this example are depicted in Table 5:

TABLE 5

The number of summed circulant matrices per sub-matrix of $A^{-1}$

| 1 | 0 | 0 | 0 | 0 |
|---|---|---|---|---|
| 1 | 1 | 0 | 0 | 0 |
| 2 | <u>1</u> | 1 | 0 | 0 |
| 4 | 2 | <u>1</u> | 1 | 0 |
| 8 | 4 | 2 | 1 | 1 |

In this example, summing $C^{-1}$ and $VA^{-1}U$ (as in Equation 11), which is the 3×3 lower left corner of $A^{-1}$ causes the underlined circulant sub-matrices to cancel out:

TABLE 6

The number of summed circulant matrices in the sub-matrices of $G = (C^{-1} + VA^{-1}U)$

| 3 | <u>0</u> | 3 |
|---|---|---|
| 4 | 3 | <u>0</u> |
| 8 | 4 | 3 |

As a result, C' in this example comprises a single L-by-L circulant matrix, positioned at the upper right corner of G, instead of a 2×2 C' matrix that would have been required without this optimization, thus further reducing the matrix multiplication complexity and the required storage space.

In some embodiments, the shift values in the circulant sub-matrices of $H_p$ are selected with cyclic shift values up to a given maximal shift $p_{max}$. In such embodiments, $H_p$ can be reorganized by permuting, at design time, the columns and rows as follows. Select the first column of each block-column for the first m columns. Similarly, select the second column of each block-column for the second m columns. Repeat this column ordering for all the block-columns of $H_p$. Apply a similar permutation procedure for the rows of $H_p$.

The permutation procedure results in a matrix $H_p'$ that comprises m-by-m sub-blocks. Moreover, $H_p'$ can be decomposed into a block upper triangular matrix A, and a square matrix C at the lower left corner, whose size does not exceed $p_{max}$·m per dimension. Calculating the parity part of the code word using $H_p'$ can be carried out using, for example, the method of FIG. 4. By designing the code with a small value of $p_{max}$, the complexity and storage requirements can be controlled, accordingly.

In some embodiments, at least part of the method of FIG. 4 is implemented in hardware. For example, a back-substitution can be implemented in hardware using elements such as multiplexers, accumulators, adders and cyclic shifters. For example, in an embodiment, in implementing the back-substitution process (e.g., as described in Equation 9) in hardware, one multiplexer selects L-sub-vectors of $\underline{y}$ and another multiplexer selects L-sub-vectors of $\underline{s}$. Multiplication of a circulant matrix by a vector is performed by a cyclic shifter module that shifts the vector cyclically in accordance with the structure of the respective circulant matrix. Intermediate results are added and stored in accumulators. In some embodiments, similar hardware architecture is used for implementing vector by matrix multiplication such as multiplying $\underline{y}$ by $G^{-1}$.

Efficient GLDPC Encoding

GLDPC codes typically comprise multiple sub-codes or component codes. GLDPC encoding produces composite code words that comprise multiple component code words, each encoded using one of the underlying component codes. The component code words, which are typically much shorter than the composite code word, may comprise any suitable linear codes, such as, for example, Hamming codes, Bose-Chaudhuri-Hocquenghem (BCH) codes, Reed-Solomon (RS) codes and Reed-Muller (RM) codes. A GLDPC code may comprise as few as thirty or less component codes, or as many as thousands or more component codes.

GLDPC codes are typically designed so that each of the component code words shares one or more bits with at least one other component code word. Thus, each bit of the composite code word belongs to a single component code word or shared among multiple component code words. A valid composite code word of the GLDPC code comprises valid component code words of the underlying component codes. The number of code words sharing each bit (or a group of bits) is referred to as the variable node degree, denoted "dv".

Assume, for example, a GLDPC code whose composite code words comprise N component code words, each having P parity bits. Each of the component codes can be defined by a respective component parity-check matrix of P rows having the length of the component code word. The GLDPC code is defined by a respective composite parity-check matrix H that comprises N block-rows corresponding to the N component code words. Each of the block-rows comprises columns of the respective component parity-check matrix and zero columns so that the total number of columns equals the length of the composite code word.

In the disclosed embodiments, the composite parity-check matrix is derived from one or more block-circulant matrices, wherein each of the block-circulant matrices comprises N block-rows, corresponding to the N component code words. A block-circulant matrix can be represented as an N-by-N array of blocks, in which zero blocks are empty, and X-blocks represent parts of a component parity-check matrix.

Tables 7 and 8 below depict example block-circulant matrices that can be used for constructing a GLDPC composite parity-check matrix, in an embodiment. The example block-circulant matrices are based on five (i.e., N=5) component codes. In addition, each of the block-circulant matrices has X-blocks on the main-diagonal and on a selected secondary-diagonal.

TABLE 7

A block-circulant matrix with X-blocks on the main-diagonal and on the first secondary-diagonal

| X |   |   |   | X |
|---|---|---|---|---|
| X | X |   |   |   |
|   | X | X |   |   |
|   |   | X | X |   |
|   |   |   | X | X |

TABLE 8

A block-circulant matrix with X-blocks on the main-diagonal and on the second secondary-diagonal

| X |   | X |   |   |
|---|---|---|---|---|
|   | X |   |   | X |
| X |   | X |   |   |
|   | X |   | X |   |
|   |   | X |   | X |

In the present example, we assume that the component code words are split into multiple G-bit groups wherein G≥1. Therefore, each of the blocks in Tables 7 and 8 represents a P-by-G block, so that X-blocks that belong to the same block-row correspond to the respective component code word. Note that in Tables 7 and 8, each block-column comprises two X-blocks, which means that in this example, G-bit groups are shared among two component code words, i.e., dv=2. Alternatively, the block-circulant matrices can have other variable node degree values, such as dv=3 or dv=1. Further alternatively, different block-columns may have different respective dv values.

When the GLDPC parity-check matrix comprises a single circulant matric, each of the block-circulant matrices in Tables 7 and 8 corresponds to a component code word of dv·G bits and a composite code word of N·G bits. To construct longer GLDPC codes, component code words longer than dv·G bits can be spread over multiple such block-circulant matrices that are concatenated horizontally. A GLDPC parity-check matrix that is constructed in this manner comprises the concatenated block-circulant matrices.

In some embodiments, encoding of a GLDPC code represented by a respective GLDPC composite parity-check matrix H is based on three main steps: 1) decomposing H into data and parity sub-matrices $H=[H_s|H_p]$, 2) calculating an intermediate vector $\underline{s}=H_s \cdot \underline{d}$ as given in Equation 3, and 3) calculating the parity vector $\underline{p}=H_p^{-1}\underline{s}$ as given in Equation 2.

For a composite code word that comprises N component code words with P parity bits per component code, the size of $H_p$ is NP-by-NP. In real-life applications, N is on the order of a hundred component code words, each comprising several tens of parity bits. Calculating the inverse of such a large $H_p$ matrix in real time is typically impractical. Additionally, storing $H_p^{-1}$ that has such dimensions in memory requires large storage space.

The GLDPC parity-check sub-matrix $H_p$ may comprise one or more block-circulant matrices. For example, in one embodiment G=1 (i.e., a single bit per group) and $H_p$ comprises P block-circulant matrices. In another embodiment, G>1, and to satisfy the constrain NP=NG that forces Hp to be a square matrix, Hp may comprise a single block-circulant matrix in which G=P. In this embodiment, G is relatively large, which may result in large probability of trapping sets in the decoder, which is undesirable. As will be described below, in some embodiments, Hp is constructed by combining multiple matrices that each comprises a full block-circulant matrix of G=P bit-columns, or a partial block-circulant matrix that comprises only 1<G<P of the entire P bit-columns.

Now we describe a method for designing Hp by interleaving multiple block-circulant matrices. When G is constant across the block-circulant matrices, the design method can be used for reducing G by a factor that equals the number of interleaved block-circulant matrices. Consider a set of multiple block-circulant matrices that are indexed in a given order. The interleaving procedure orders the block-columns by selecting the first block-column from each block-circulant matrix according to the given order, then selecting the second block-column from each block-circulant matrix according to the same order, and so on.

For example, interleaving the block-circulant matrices of Tables 7 and 8 results in a matrix as depicted in Table 9, below. The blocks of the interleaved matrix are P bits high and G=P/2 bits wide, and are classified as XA-blocks and XC-blocks for the sake of matrix decomposition, as will be described herein. Note that in the present example, all of the XC-blocks appear only within the two most upper block-rows. More generally, the XC-blocks appear within a number of upper block-rows whose number depends on the structure of the actual block-circulant matrices chosen, and this number is bounded from below by the number of the unique block-circulant matrices.

TABLE 9

Interleaved matrix of the two block-circulant matrices of Tables 7 and 8

| XA | XA |    |    |    |    |    | XC | XC |    |
|----|----|----|----|----|----|----|----|----|----|
| XC |    | XA | XA |    |    |    |    |    | XC |
|    | XA | XA |    | XA | XA |    |    |    |    |
|    |    |    | XA | XA |    | XA | XA |    |    |
|    |    |    |    |    | XA | XA |    | XA | XA |

Next we show that $H_p$ can be presented as a combination of properly selected A and C matrices. The left XC-block of the second block-row can be re-positioned at the seventh block-column of the same block-row, and the result matrix is depicted in Table 10 below.

TABLE 10

Permuted version of the matrix in Table 9

| XA | XA |    |    |    |    |    | XC | XC |    |
|----|----|----|----|----|----|----|----|----|----|
|    |    | XA | XA |    |    | XC |    |    | XC |
|    | XA | XA |    | XA | XA |    |    |    |    |
|    |    |    | XA | XA |    | XA | XA |    |    |
|    |    |    |    |    | XA | XA |    | XA | XA |

By considering the matrix in Table 10 as comprising joint blocks made from pairs of horizontal neighboring blocks, the matrix can be decomposed into a block lower triangular matrix A that comprises the XA blocks, and a matrix C at the upper right corner comprising the XC blocks. Moreover, the matrix of Table 9 that represents $H_p$, can be represented as $H_p$=A+UCV (similarly to Equation 4) with suitably selected placement matrices U and V. Note that in alternative embodiments, other decomposition schemes of $H_p$ can also be used.

Using the above described design method, the GLDPC encoder can be implemented similarly to the QC-LDPC encoder described above. For example, since in Table 10, the matrix A comprises a block lower triangular matrix, solving $y=A^{-1}s$ can be carried out using back-substitution. In addition, the size of the matrix C in Table 10 is 2P-by-2P, which is much smaller than the size NP-by-NP of the original matrix and therefore results in reduced complexity and storage space.

The size of the matrix C depends on the structure of the underlying block-circulant matrices. In the present example, the block-circulant matrices of Tables 7 and 8 have one and two wrapped-around columns, respectively, and since 2=max(1,2), two component codes are forced to participate in C, and therefore the matrix C has the size 2P-by-2P.

Using the above described design method, GLDPC encoding can be carried out using an efficient method similar to the method of FIG. 4. In this case, the back-substitution procedure that is applied at steps 108 and 116 changes, however, since the $A_{ij}$ sub-matrices in the GLDPC case are not circulant and therefore inverting in the equations system in Equation 9 cannot be implemented using a cyclic shifter module. Each of the $A_{ij}$ sub-matrices comprises several XA blocks to obtain a P-by-P matrix. Instead of applying online matrix inversion to calculate $A_{ii}^{-1}$, in some embodiments, $A_{ii}^{-1}$ are pre-calculated and stored, and are applied using matrix multiplication. This scheme is still very efficient (in complexity and storage space), since the size of $A_{ii}$ is only P-by-P bits. In alternative embodiments, the inverse matrices $A_{ii}^{-1}$ are computed online at $O(N*P^3)$ complexity, which is significantly lower than the complexity $O(N^3 \cdot P^3)$ that would be required in inverting $H_p$ online. Moreover, the size of the matrix C, or equivalently the size of $W^{-1}$ at step 112 (Equation 11) is typically much smaller than P·N (as explained above, the size of C depends on the structure of the underlying block-circulant matrices), and therefore is very efficient in terms of complexity and storage space.

Example GLDPC Encoder with BCH Component Codes

In this section we describe a design procedure of a GLDPC code having 8 Kbyte code words and a code rate equal to 0.94. The underlying component codes comprise BCH (978, 1008) codes with error correction capability T=3 (i.e., each component code can correct up to three errors). Each of the BCH component code words has P=30 parity bits. The number of BCH code words in this case is N=139, resulting in a total of N·P=139·30=4170 parity bits. The GLDPC code design in this example is based on four block-circulant matrices and dv=2 as defined in Table 11:

TABLE 11

Block-circulant matrices parameters

| Index of the secondary diagonal | Bits per block-column (G bits) |
|---|---|
| 2 | 6 |
| 3 | 8 |
| 4 | 8 |
| 5 | 8 |

In the present example, partial block-columns (i.e., 6 out of the 8 bit-columns) of the first block-circulant matrix are assigned to parity bits so that $H_p$ is square. This partitioning scheme is equivalent to breaking down the G=8 block-circulant matrix into two sub-matrices having G1=6 & G2=2 bit-columns, assigning the G1 part for encoding (i.e., parity), and the G2 part to the data part of the code word.

Each block-circulant matrix comprises 139 block-rows of 30 bits in height. Since the numbers of bits per block-column add up to 30 bits, the total number of parity bits equals 139·30=1470 as required. Note that in the present example, the group size G is not constant and gets two possible values, i.e., 8 bits or 6 bits.

Interleaving the four block-circulant matrices, results in a square matrix that comprises 1470 bits per dimension. The upper-left and upper-right corners of this interleaved matrix are depicted in Tables 12 and 13, respectively. In these tables, X1 . . . X6 and Xa . . . Xj are the blocks of which the matrix C is comprised, after applying proper U and V placement matrices.

TABLE 12

Upper-left corner

| X | X | X | X |   |   |   |   |   |   |   |   |   |   |   |   |
|---|---|---|---|---|---|---|---|---|---|---|---|---|---|---|---|
| X1|   |   |   | X | X | X | X |   |   |   |   |   |   |   |   |
|   | X2|   |   | X4|   |   |   | X | X | X | X |   |   |   |   |
|   |   | X3|   |   | X5|   |   | X6|   |   |   | X | X | X | X |
|   |   |   | X |   |   | X |   |   |   | X |   |   | X | X | X | X |
|   |   |   |   |   | X |   |   | X |   |   | X |   | X |   |   |
|   |   |   |   |   |   |   |   |   | X |   |   | X |   | X |   |
|   |   |   |   |   |   |   |   |   |   |   | X |   |   | X |   |
|   |   |   |   |   |   |   |   |   |   |   |   |   |   |   | X |

TABLE 13

Upper-right corner

|   |   |   |   |   | Xa|   |   | Xb|   |   | Xc|   |   | Xd|   |   |
|---|---|---|---|---|---|---|---|---|---|---|---|---|---|---|---|---|
|   |   |   |   |   |   |   | Xe|   |   | Xf|   |   | Xg|   |   |   |
|   |   |   |   |   |   |   |   |   |   |   |   | Xh|   |   | Xi|   |
|   |   |   |   |   |   |   |   |   |   |   |   |   |   |   |   | Xj|
|   |   |   |   |   |   |   |   |   |   |   |   |   |   |   |   |   |
|   |   |   |   |   |   |   |   |   |   |   |   |   |   |   |   |   |
|   |   |   |   |   |   |   |   |   |   |   |   |   |   |   |   |   |
|   |   |   |   |   |   |   |   |   |   |   |   |   |   |   |   |   |

TABLE 14

Upper right corner prior to applying suitable placement matrices U and V.

|   |   |   |   |   |   |   | Xa| Xb|   | Xc|   |   | Xd|   |   |
|---|---|---|---|---|---|---|---|---|---|---|---|---|---|---|---|
|   | X1|   |   |   |   |   |   |   | Xe|   | Xf|   |   | Xg|   |
|   |   | X2|   | X4|   |   |   |   |   |   |   | Xh|   |   | Xi|
|   |   |   | X3|   | X5| X6|   |   |   |   |   |   |   |   | Xj|
|   |   |   |   |   |   |   |   |   |   |   |   |   |   |   |   |
|   |   |   |   |   |   |   |   |   |   |   |   |   |   |   |   |

In this example, the size of the matrix $W^{-1}$ that is pre-calculated and stored is $(4 \cdot 30)^2$ bits. Direct computation of Equation 2, on the other hand, requires a storage space of $(139 \cdot 30)^2$ bits. The storage space improvement ratio in this example is therefore $(4/139)^2$ or about 0.083%.

The methods for encoding and code design described above are given by way of example and in alternative embodiments other encoding and code design methods can also be used. For example, although the description above refers mainly to QC-LDPC and GLDPC code, the disclosed embodiments are applicable to other types of codes such as, for example, LDPC. In general, the disclosed techniques are applicable to any systematic code that can be represented by a parity-check matrix.

As another example, although in the embodiments described above the decomposition of $H_p$ refers mainly to a matrix A that is a block lower triangular matrix, block upper triangular matrix and patterns derived by flipping these matrices can also be used. The disclosed techniques are additionally applicable to cases in which $H_p$ can be decomposed as Hp=A+UCV, wherein A is any matrix for which the complexity of solving a matrix equation of the form $A\underline{y}=\underline{s}$ (solving for $\underline{y}$) is lower than online inversion of $H_p$–$O(n^3)$, and/or A requires a smaller storage space than $H_p$, and storing $W^{-1}$ wherein $W=(C^{-1}+V \cdot A^{-1} \cdot U)$ also requires a storage space that is smaller than the space required for storing the full $H_p$ matrix.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data encoding, comprising:
 configuring a data encoder for encoding data with a code which can be defined by a parity-check matrix H formed of a data sub-matrix $H_s$ and a parity-check sub-matrix $H_p$, by storing, in a memory, the data sub-matrix $H_s$, and pre-calculated values of functions of matrices A, C, U and V of a decomposition of $H_p$ of the form $H_p=A+UCV$, where A is a block triangular matrix, C is a matrix that is smaller than $H_p$, and the matrices U and V are placement matrices, wherein the storage space of the pre-calculated values is smaller than required to store an inverse of $H_p$;

receiving, via an interface of the data encoder, a data vector for transmission or storage;

producing, by encoding circuitry of the data encoder, an intermediate vector $\bar{s}$ by multiplying the data vector by the data sub-matrix $H_s$;

calculating a vector $\bar{y}$ which fulfils the equation $\underline{y}=A^{-1}\underline{s}$ from the produced intermediate vector $\bar{s}$ and one or more of the pre-calculated values stored in the memory;

calculating a modified vector $\bar{s}'$, which fulfils the equation $\underline{s}'=\underline{s}-UW^{-1}V\cdot\underline{y}$, where $W^{-1}=(C^{-1}+VA^{-1}U)^{-1}$, from the vector $\bar{y}$, the produced intermediate vector $\bar{s}$, and one or more of the pre-calculated values stored in the memory;

deriving, by the encoding circuitry, a parity part p of a code word, which fulfils the equation $A\underline{p}=\underline{s}'$, using the modified vector $\bar{s}'$ and pre-calculated values stored in the memory;

generating a code word representing the received data vector, as a function of the received data vector and the derived parity part p;

transmitting or storing the code word to a device, wherein the code word is corrupted due to the transmitting or storing; and decoding the corrupted code word to recover the data vector.

2. The method according to claim 1, wherein calculating the vector $\bar{\gamma}$ comprises solving an equation of a form $A\cdot\bar{y}=\bar{x}$ using a back-substitution process.

3. The method according to claim 1, wherein calculating the modified vector $\bar{s}'$ comprises multiplying a matrix $UW^{-1}V$ by the calculated vector $\bar{y}$.

4. The method according to claim 3, wherein the matrix $W^{-1}$ is pre-calculated and stored in the memory before receiving the data vector.

5. The method according to claim 3, wherein multiplying the matrix $UW^1V$ by the vector $\bar{y}$ comprises applying a sequence of operations to the vector $\bar{y}$ based on a decomposition of the matrix W using matrices A', C', U' and V', wherein A' is a block triangular matrix that has the same size as W, C' is a matrix that is smaller than W, and the matrices U' and V' are placement matrices that are selected so that A', C', U' and V' satisfy a matrix equation $W=A'+U'C'V'$.

6. The method according to claim 1, wherein the parity-check sub-matrix $H_p$ comprises multiple circulant sub-matrices structured from cyclically shifted versions of an identity matrix, and wherein calculating the modified vector $\bar{s}'$ comprises performing a matrix multiplication of $W^{-1}$ by applying vector cyclic shift operations in accordance with a structure of the respective circulant sub-matrices.

7. The method according to claim 1, wherein the code comprises multiple component codes, wherein the parity-check sub-matrix $H_p$ comprises one or more block-circulant matrices, each comprising multiple blocks that belong to respective component parity-check matrices of the component codes.

8. The method according to claim 7, wherein the parity-check sub-matrix $H_p$ comprises interleaved block-columns of the block-circulant matrices.

9. The method according to claim 1, wherein providing the code word to a device comprises storing the code word in a memory device.

10. The method according to claim 1, wherein providing the code word to a device comprises transmitting the code word over a communication system, and wherein decoding the code word comprises decoding by a receiver receiving the transmitted code word, so as to reconstruct the data vector.

11. A data encoder, comprising:

an interface, which is configured to receive a data vector for transmission or storage;

a memory storing information for encoding data with a code, which can be defined by a parity-check matrix H formed of a data sub-matrix $H_s$ and a parity sub-matrix $H_p$, the information including a data sub-matrix $H_s$, and pre-calculated values of functions of matrices A, C, U and V of a decomposition of $H_p$ of the form $H_p=A+UCV$, where A is a block triangular matrix, C is a matrix that is smaller than $H_p$, and the matrices U and V are placement matrices, wherein the storage space of the pre-calculated values is smaller than required to store an inverse of $H_p$;

encoding circuitry, which is configured to:
produce an intermediate vector $\bar{y}$ by multiplying the data vector by the data sub-matrix $H_s$, calculate a vector $\bar{y}$ which fulfils the equation $\underline{y}=A^{-1}\underline{s}$ from the produced intermediate vector $\bar{s}$ and one or more of the pre-calculated values stored in the memory, calculate a modified vector $\bar{s}'$, which fulfils the equation $\underline{s}'=\underline{s}-UW^{-1}V\cdot\underline{y}$, where $W^{-1}=(C^{-1}+VA^{-1}U)^{-1}$, from the vector y, the produced intermediate vector $\bar{s}$, and one or more of the pre-calculated values stored in the memory, derive a parity part p of a code word, which fulfils the equation $A\underline{p}=\underline{s}'$, using the modified vector $\bar{s}'$ and pre-calculated values stored in the memory, and generate a code word representing the received data vector, as a function of the received data vector and the derived parity part; and an output interface configured to transmit or store the code word to a device, wherein some code words transmitted or stored by the output interface get corrupted while being stored or transmitted, and wherein the corrupted code words are decoded to recover the data vector.

12. The data encoder according to claim 11, wherein the encoding circuitry is configured to solve an equation of a form $A\cdot\bar{y}=\bar{x}$ using a back-substitution process in calculating the vector $\bar{y}$.

13. The data encoder according to claim 11, wherein the encoding circuitry is configured to multiply a matrix $UW^{-1}V$ by the calculated vector $\bar{y}$ in calculating the modified vector $\bar{s}'$.

14. The data encoder according to claim 13, wherein the matrix $W^{-1}$ is pre-calculated and stored in the memory before the data vector is received.

15. The data encoder according to claim 11, wherein the parity sub-matrix $H_p$ comprises multiple circulant sub-matrices structured from cyclically shifted versions of an identity matrix, and wherein the encoding circuitry is configured to apply vector cyclic shift operations in accordance with a structure of the respective circulant sub-matrices.

16. The data encoder according to claim 11, wherein the code comprises multiple component codes, wherein the parity sub-matrix $H_p$ comprises one or more block-circulant matrices, each comprising multiple blocks that belong to respective component parity-check matrices of the component codes.

17. The data encoder according to claim 16, wherein the parity sub-matrix $H_p$ comprises interleaved block-columns of the block-circulant matrices.

18. A computer software product, the product comprising a tangible non-transitory computer-readable medium in which program instructions are stored, which instructions, when read by a processor of a data encoder, cause the processor to be configured for encoding data with a code which can be defined by a parity-check matrix H formed of a data sub-matrix $H_s$ and a parity-check sub-matrix $H_p$, by storing, in a memory, the data sub-matrix $H_s$, and pre-calculated values of functions of matrices A, C, U and V of a decomposition of $H_p$ of the form $H_p$=A+UCV, where A is a block triangular matrix, C is a matrix that is smaller than $H_p$, and the matrices U and V are placement matrices, wherein the storage space of the pre-calculated values is smaller than required to store an inverse of $H_p$, to receive, via an interface of the data encoder, a data vector for transmission or storage to be encoded into a code word to produce an intermediate vector s by multiplying the data vector by the data sub-matrix $H_s$, to calculate a vector $\bar{y}$ which fulfils the equation $\underline{y}=A^{-1}\underline{s}$ from the produced intermediate vector $\bar{s}$ and one or more of the pre-calculated values stored in the memory, to calculate a modified vector $\bar{s}'$, which fulfils the equation $\underline{s}'=\underline{s}-UW^{-1}V\cdot\underline{y}$, where $W^{-1}=(C^{-1}+VA^{-1}U)^{-1}$, from the vector $\bar{y}$, the produced intermediate vector $\bar{s}$, and one or more of the pre-calculated values stored in the memory, to derive a parity part p of the code word, which fulfils the equation $A\underline{p}=\underline{s}'$, using the modified vector $\bar{s}'$ and pre-calculated values stored in the memory, to generate a code word representing the received data vector, as a function of the received data vector and the derived parity part, and to transmit or store the code word to a device, wherein some code words transmitted or stored by the output interface get corrupted in the transmission or storing, and wherein the corrupted code words are decoded to recover the data vector.

19. The method according to claim 1, wherein deriving the parity part comprises calculating the parity part by solving an equation of a form $A\underline{p}=\underline{s}'$ using a back-substitution process.

20. The method according to claim 1, wherein storing, in the memory pre-calculated values of functions of matrices A, C, U and V comprises storing $A_{ij}$ sub-matrices of matrix A and wherein calculating the vector $\bar{y}$ comprises inverting the diagonal $A_{ii}$ sub-blocks online.

21. The method according to claim 1, wherein storing, in the memory pre-calculated values of functions of matrices A, C, U and V comprises storing precalculated inverted values of the diagonal $A_{ii}$ sub-blocks and wherein calculating the vector y comprises using the stored precalculated inverted values of the diagonal $A_{ii}$ sub-blocks.

22. The method according to claim 4, wherein the matrix $W^{-1}$ is the same size as C.

23. The method according to claim 2, wherein the back-substitution process is implemented in hardware.

24. The method according to claim 1, wherein the acts performed in deriving the parity part P for the received data vector require less computation complexity than inverting $H_p$.

* * * * *